US011047940B2

(12) United States Patent
Findeklee et al.

(10) Patent No.: US 11,047,940 B2
(45) Date of Patent: Jun. 29, 2021

(54) PASSIVE RF SHIM RESONATOR FR FIELD HOMOGENIZATION OF AN RF ANTENNA DEVICE FOR TX MODE AND RX MODE

(71) Applicant: KONINKLIJKE PHILIPS N.V., Eindhoven (NL)

(72) Inventors: Christian Findeklee, Norderstedt (DE); Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/629,587

(22) PCT Filed: Jul. 12, 2018

(86) PCT No.: PCT/EP2018/068928
§ 371 (c)(1),
(2) Date: Jan. 9, 2020

(87) PCT Pub. No.: WO2019/012036
PCT Pub. Date: Jan. 17, 2019

(65) Prior Publication Data
US 2021/0141039 A1    May 13, 2021

(30) Foreign Application Priority Data

Jul. 13, 2017    (EP) .................................... 17181256

(51) Int. Cl.
*G01R 33/385* (2006.01)
*G01R 33/54* (2006.01)
*G01R 33/36* (2006.01)
(52) U.S. Cl.
CPC ....... *G01R 33/385* (2013.01); *G01R 33/3642* (2013.01); *G01R 33/543* (2013.01)
(58) Field of Classification Search
CPC . G01R 33/385; G01R 33/3642; G01R 33/543
See application file for complete search history.

(56) References Cited

U.S. PATENT DOCUMENTS

| 5,160,890 A | 11/1992 | Roschmann |
| 8,948,844 B2 * | 2/2015 | Biber ..................... A61B 5/708 600/422 |

(Continued)

OTHER PUBLICATIONS

Aussenhofer et al "Design and Evaluation of a Detunable Water-Based Quadrature HEM11 Mode Dielectric Resonator as a New Type of Volume Coil for High Field MRI" Magnetic Reson. in Med. vol. 68, No. 4 Aug. 6, 2012.

(Continued)

*Primary Examiner* — G. M. A Hyder (57) ABSTRACT

The present invention provides a passive radio frequency (RF) shim resonator (144) for field homogenization of an RF field emitted by an RF antenna device (140) of a magnetic resonance (MR) imaging system (110), whereby the passive RF shim resonator (144) has a first resonating capability and a second resonating capability, and the passive RF shim resonator (144) comprises a switching device, whereby the switching device is adapted to switch between the first and the second resonating capability in accordance with a TX-mode and a RX-mode of the RF field emitted by the RF antenna device (140) of the MR imaging system (110). The present invention further provides a patient bed (142) or a patient mattress for use in a magnetic resonance imaging (MRI) system (110), whereby the patient bed (142) or the patient mattress comprises an above passive RF shim resonator (144). The present invention further provides a RF antenna device for generating and/or receiving a RF field for use in a MRI system (110), whereby the RF antenna device (140) comprises a coil housing and an above passive RF shim resonator (144), wherein the passive RF shim resonator (144) is located within the coil housing. The present invention also provides a magnetic resonance (MR) imaging system (110), comprising an above patient bed (142) or (Continued)

patient mattress or at least one above RF antenna device (140).

15 Claims, 8 Drawing Sheets

(56) References Cited

U.S. PATENT DOCUMENTS

| | | |
|---|---|---|
| 2002/0190717 A1 | 12/2002 | Leussler et al. |
| 2008/0180102 A1 | 7/2008 | Lazar et al. |
| 2009/0021256 A1* | 1/2009 | Soutome .......... G01R 33/34046 324/318 |
| 2010/0213941 A1 | 8/2010 | Driesel et al. |
| 2010/0277174 A1 | 11/2010 | Van Den Brink et al. |
| 2013/0021033 A1 | 1/2013 | Stoeckel et al. |
| 2013/0165768 A1 | 6/2013 | Biber |
| 2013/0278262 A1 | 10/2013 | Zhai et al. |
| 2016/0252594 A1 | 9/2016 | Biber |

OTHER PUBLICATIONS

International Search Report and Written Opinion From PCT/EP2018/068928 dated Oct. 18, 2018.

* cited by examiner

PASSIVE RF SHIM RESONATOR FR FIELD HOMOGENIZATION OF AN RF ANTENNA DEVICE FOR TX MODE AND RX MODE

CROSS REFERENCE TO RELATED APPLICATIONS

This application is a U.S. national phase application of International Application No. PCT/EP2018/068928 filed on Jul. 12, 2018, which claims the benefit of EP Application Serial No. 17181256.3 filed on Jul. 13, 2017 and is incorporated herein by reference.

FIELD OF THE INVENTION

The invention relates to the field of magnetic resonance (MR) imaging systems, in particular to the technical field of field homogenization of an RF field emitted by an RF antenna device of a MR imaging system.

The invention relates in particular to a passive radio frequency (RF) shim resonator for field homogenization of an RF field emitted by an RF antenna device of a magnetic resonance (MR) imaging system.

The invention also relates to a patient bed or a patient mattress for use in a magnetic resonance imaging (MRI) system.

The invention further relates to a radio frequency (RF) antenna device for generating and/or receiving a RF field for use in a magnetic resonance imaging (MRI) system, whereby the RF antenna device comprises a coil housing and an above passive radio frequency (RF) shim resonator for field homogenization of an RF field emitted by an RF antenna.

The invention still further relates to a magnetic resonance (MR) imaging system, comprising a main magnet for generating a static magnetic field, a magnetic gradient coil system for generating gradient magnetic fields superimposed to the static magnetic field, and at least one radio frequency (RF) antenna device for generating a RF field.

The invention in particular also relates to a magnetic resonance (MR) imaging system, comprising a main magnet for generating a static magnetic field, a magnetic gradient coil system for generating gradient magnetic fields superimposed to the static magnetic field, and at least one radio frequency (RF) antenna device for generating a RF field.

The invention in particular also relates to a method for improving field homogenization of an RF field emitted by an RF antenna device of a magnetic resonance (MR) imaging system.

BACKGROUND OF THE INVENTION

In high field magnetic resonance imaging (MRI), image quality often suffers from poor B1 field homogeneity caused by wave propagation effects of the RF field. Thus, field inhomogeneity continues to be a major challenge in today's high-field magnetic resonance (MR) examination systems, in particular for latest MR examination systems with strong magnetic fields of 3T or 7T. Among various RF coils designed to address this problem, birdcage coils with rungs extending in directions not linear compared to a longitudinal direction of the RF coils have been introduced to improve field homogeneity for MRI imaging.

To overcome the above problem and to improve homogeneity of the electromagnetic fields, a very pragmatic, simple and cheap solution to this problem is the use of dielectric pads, which can have a smoothing effect on the transmit field. In a similar way, local passive resonators can act similarly compared to dielectric pads. Hence, such artificial dielectric and/or narrow-band permeable materials can be further used in MRI to improve field homogeneity and to reduce patient specific SAR.

A drawback of these known methods is that these materials have different optimal shape for maximized transmit and receive performance. Accordingly, the effects on TX and RX mode can be different, i.e. a beneficial effect on the electromagnetic field in TX mode can have negative effects on RX mode, and vice versa. This applies even more in case of a coil design, where rungs of the antenna do not extend in the longitudinal direction of the RF coil. In contrast, independent rung structures can be provided, which are optimized for TX mode and RX mode. In this case, standard RF coil symmetry compared to a standard birdcage coil is broken, since there are typically two orientations for a non-linear extension of the rung conductors of the RF coil.

The US-patent application US2013/0165768 concerns a breast coil with an HF correction coil element. During magnetic resonance recording (i.e. in receive mode) the HF correction element influence the local B1-field to homogenise the B1-field as far as possible.

A single resonator for simultaneous optimization of the RF field for transmit and receive performance is not possible.

SUMMARY OF THE INVENTION

It is an object of the invention to provide a passive radio frequency (RF) shim resonator for field homogenization of an RF field emitted by an RF antenna device of a magnetic resonance (MR) imaging system, a patient bed or a patient mattress for use in a magnetic resonance imaging (MRI) system, a radio frequency (RF) antenna device for generating and/or receiving a RF field for use in a magnetic resonance imaging (MRI) system, a magnetic resonance (MR) imaging system, a method for improving field homogenization of an RF field emitted by an RF antenna device of a magnetic resonance (MR) imaging system which enable MR imaging with optimized RF fields for RX and TX mode.

This object is achieved by a passive radio frequency (RF) shim resonator for field homogenization of an RF field emitted by an RF antenna device of a magnetic resonance (MR) imaging system, whereby the passive RF shim resonator has a first resonating capability and a second resonating capability, and the passive RF shim resonator comprises a switching device, whereby the switching device is adapted to switch between the first and the second resonating capability in accordance with a TX-mode and a RX-mode of the RF field emitted by the RF antenna device of the MR imaging system.

This object is further achieved by a patient bed or a patient mattress for use in a magnetic resonance imaging (MRI) system, whereby the patient bed or the patient mattress comprises an above passive radio frequency (RF) shim resonator for field homogenization of an RF field emitted by an RF antenna device of a MR imaging system.

This object is also achieved by a radio frequency (RF) antenna device for generating and/or receiving a RF field for use in a magnetic resonance imaging (MRI) system, whereby the RF antenna device comprises a coil housing and an above passive radio frequency (RF) shim resonator for field homogenization of an RF field emitted by the RF antenna device, wherein the passive RF shim resonator is located within the coil housing.

This object is still further achieved by a magnetic resonance (MR) imaging system, comprising a main magnet for generating a static magnetic field, a magnetic gradient coil system for generating gradient magnetic fields superimposed to the static magnetic field, and at least one radio frequency (RF) antenna device for generating a RF field, wherein the magnetic resonance (MR) imaging system further comprises an above patient bed or a patient mattress.

This object is furthermore achieved by a magnetic resonance (MR) imaging system, comprising a main magnet for generating a static magnetic field, a magnetic gradient coil system for generating gradient magnetic fields superimposed to the static magnetic field, and at least one radio frequency (RF) antenna device for generating a RF field, wherein the at least one RF antenna device is an above RF antenna device.

This object is also achieved by a method for improving field homogenization of an RF field emitted by an RF antenna device of a magnetic resonance (MR) imaging system, comprising the method steps of providing a passive RF shim resonator having a first resonating capability and a second resonating capability in accordance with a TX-mode and a RX-mode of the RF antenna device, determining a TX-mode and a RX-mode of the RF antenna device of the MR imaging system, and switching the passive RF shim resonator between the first and the second resonating capability in accordance with the TX-mode and the RX-mode of the RF field emitted by the RF antenna device of the MR imaging system.

Hence, when switching the passive RF shim resonator between TX mode or transmit mode and RX mode or receive mode, in-line with respective operation modes of the MR imaging system, optimal configuration for both, transmit mode and receive mode, can be achieved. This is possible, since in MRI, transmission and reception are performed sequentially. Using the switching device, a suitable configuration of the passive RF shim resonator can be chosen to improve in each case performance of the MR imaging system. In order to provide the different resonating capabilities, different approaches can be applied, e.g. providing the resonating capabilities independently or using at least partly the same structures. Therefore, the passive RF shim resonator as a whole can be adapted to the different applications by performing a switching operation. In this context, it is preferred that the first and the second resonating capability are provided in accordance with the TX mode and a RX mode of the RF field emitted by the RF antenna device of the MR imaging system. Hence, the passive RF shim resonator can be switched between a transmit state and a receive state, each optimized for the corresponding rotating field component. The passive RF shim resonator can be implemented in different components of the MR imaging system, e.g. the patient bed, a coil housing or a patient mattress. The passive RF shim resonator can be provided alone or combined with at least one ceramic dielectric pad. Accordingly, an optimal configuration for both, transmit mode and receive mode of the MR imaging system can be achieved. For transmit mode, B1+ homogeneity and SAR are optimized, whereas in receive mode, B1− homogeneity and SNR are optimally increased. Spatial variations of the RF field emitted by the RF antenna, i.e. the transmit coil of the MRI system, can be reduced.

The switching device refers to a set of individual switching units, which are switched to commonly achieve field homogenization of an RF field emitted by an RF antenna device of the MR imaging system. However, the switching device can comprise only a single switching unit.

According to a modified embodiment, the passive RF shim resonator comprises a single or multiple electromagnetically coupled resonant loops, the switching device comprises at least one switching unit arranged in the single or multiple electromagnetically coupled resonant loops, and the switching device is operated so that the at least one switching unit switches the single or multiple electromagnetically coupled resonant loops to provide the first and the second resonating capability using the single or multiple electromagnetically coupled resonant loops. Hence, depending on TX mode or RX mode of the RF coil, the at least one switching unit can be used to select and activate resonant loops as required. The resonant loops for TX mode and RX mode can share at least part of their loops. Alternatively, the resonant loops for TX mode and RX mode can be individual resonant loops.

According to a modified embodiment, the passive RF shim resonator comprises multiple electromagnetically coupled resonant loops, the resonant loops are arranged in a 2D or 3D grid structure forming an artificial dielectric, the switching device comprises multiple switching units arranged in the multiple electromagnetically coupled resonant loops, and the switching units switch the single or multiple electromagnetically coupled resonant loops to provide the first and the second resonating capability using the single or multiple electromagnetically coupled resonant loops. Based on the grid structure of the resonant loops, a homogenous passive RF shim resonator can be provided. This facilitates manufacturing of the passive RF shim resonator. Furthermore, the grid structure facilitates optimization of the RF field of the MR imaging system, since the RF field can be easily controlled in all coordinate axis. The switching units can be provided in branches of the grid structure depending on desired shapes of the resonant loops to be achieved.

According to a modified embodiment, the resonant loops are arranged in branches interconnecting connecting points of the grid structure. Accordingly, the resonant loops can be formed and activated by interconnecting branches of the grid structure. Hence, depending on the TX mode or Rx mode, different sets of branches can be connected to form resonant loops. The resonant loops for TX mode and for RX mode can be independent from each other. However, it is also possible that the resonant loops for TX mode and for RX mode at least partially share branches of the grid structure. Furthermore, it is possible that some of the branches are not used at all. The branches may have detuning components or circuits, so that the respective branches with the respective detuning capabilities can be activated as required.

According to a modified embodiment, the passive RF shim resonator comprises a single or multiple electromagnetically coupled transmission lines, the switching device comprises at least one switching unit arranged in the single or multiple electromagnetically coupled transmission lines, and the is operated so that the at least one switching unit switches the single or multiple electromagnetically coupled transmission lines to provide the first and the second resonating capability using the single or multiple electromagnetically coupled transmission lines. The transmission lines may comprise different kinds of switching units formed by electronic components such as PIN-diodes, Schottky-diodes or transistors. E.g., the PIN diodes can switch the transmission line on for a significant induced voltage. The switching operation can be performed to adapt the behavior of the transmission line for transmit phase and for receive phase. Two switching units can be arranged in an antiparallel configuration to enable full control for both directions.

Furthermore, the switching units can be provided within the branch in a sub-branch, which is arranged in parallel with a further sub-branch. Accordingly, the branch can be switched off e.g. during transmit phase and can be active in the receive phase.

According to a modified embodiment, the passive RF shim resonator comprises a single or multiple coupled dielectric resonators, the switching device comprises at least one switching unit arranged in the single or multiple coupled dielectric resonators, and the switching device is operated so that the at least one switching unit switches the single or multiple coupled dielectric resonators to provide the first and the second resonating capability using the single or multiple coupled dielectric resonators. Hence, one dielectric resonator or multiple coupled dielectric resonators can be provided in order to provide the first and the second resonating capability in accordance with the TX-mode and the RX-mode of the RF field emitted by the RF antenna device of the MR imaging system.

According to a modified embodiment, the switching device comprises at least one switchable resonant circuit. The resonant circuit can be used to adapt the resonant frequency depending on TX mode or RX mode. The resonant circuit can comprise any kind of suitable switching unit to switch the resonant circuit between different resonant frequencies, which enables RF field homogenization and/or optimization. Due to the resonant capabilities, i.e. the resonant frequency of the resonant circuit, the behavior of the passive RF shim resonator can be modified switching between the first and the second resonating capability in accordance with the TX-mode and the RX-mode of the RF field emitted by the RF antenna device of the MR imaging system. The switching of the passive RF shim resonator can be performed by means of switching units including electric components such as PIN-diodes, Schottky-diodes or transistors.

According to a modified embodiment, the switching device is an actively controllable switching device, the passive RF shim resonator comprises a control unit, whereby the control unit is adapted to actively switch the switching device between the first and the second resonating capability in accordance with a TX-mode and a RX-mode of the RF field emitted by the RF antenna device of the MR imaging system. Accordingly, a control of the switching device can be performed to switch the passive RF shim resonator in accordance with the TX-mode and the RX-mode of the RF field. Actively switching the switching device enables a high degree of freedom to operate the switching units. The control unit is preferably synchronized with a control of the TX mode and the RX mode of the MR imaging system. The switching units can be e.g. PIN-diodes, Schottky-diodes or transistors, which are actively controlled by the control unit. The transistor can be actively controlled via its control pin, whereas the diodes can be actively controlled e.g. by providing a switching voltage between their contact pins.

According to a modified embodiment, the switching device is a passive switching device, and the switching device passively switches between the first and the second resonating capability in accordance with a TX-mode and a RX-mode of the RF field emitted by the RF antenna device of the MR imaging system. Thus, the B1 transmit field can be used to switch the switching units. This can be done in a similar way as known in the art e.g. for switching local receive coils. Hence, the B1 transmit field can be used e.g. to switch of a part of the resonator. The switching of the passive RF shim resonator can be performed by means of electric components such as PIN-diodes, Schottky-diodes or transistors.

According to a modified embodiment, the first resonating capability is adapted to achieve field optimization for a transmit field of the RF coil, and the second resonating capability adapted to achieve field homogenization for a receive field of the RF coil, or vice versa.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
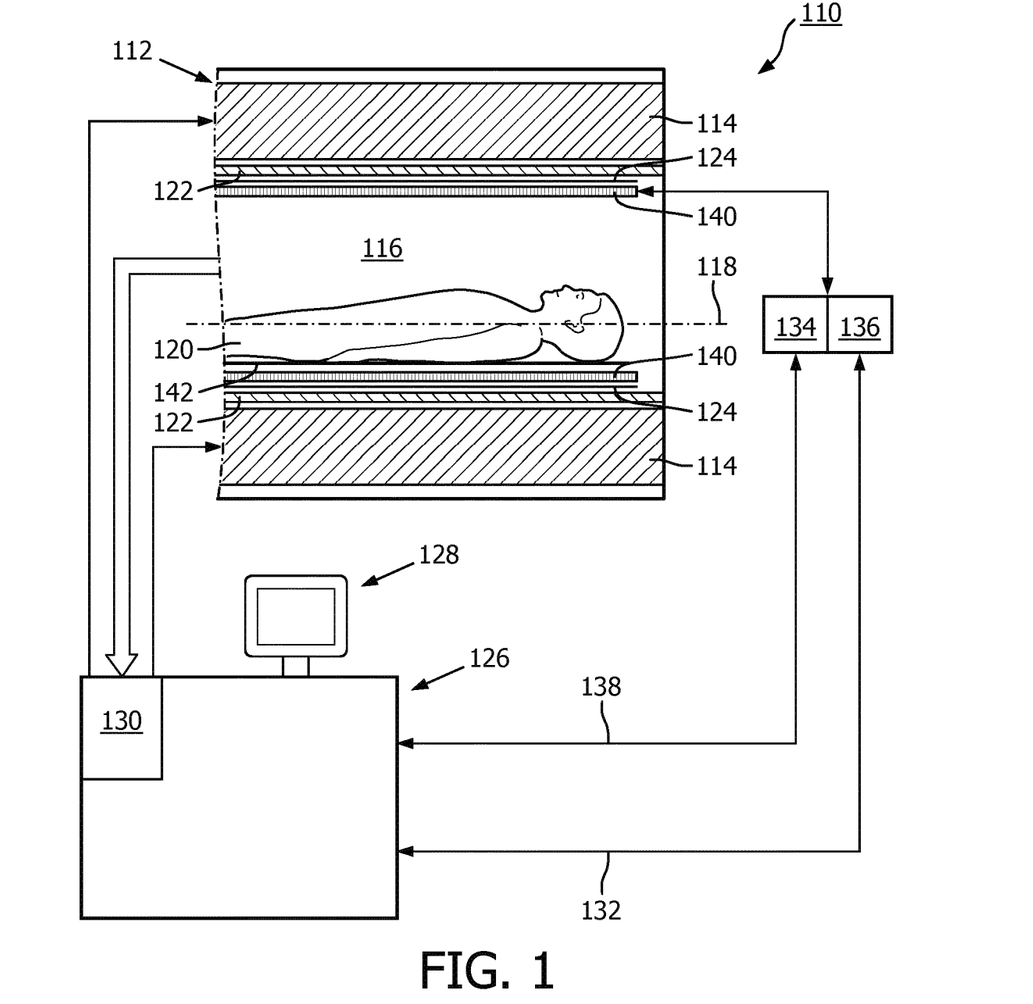
FIG. 1 is a schematic illustration of a part of a first, preferred embodiment of a magnetic resonance (MR) imaging system.

FIG. 1 shows a schematic illustration of a part of a magnetic resonance (MR) imaging system 110 comprising an MR scanner 112 according to a first, preferred embodiment. The MR imaging system 110 of the first embodiment is described here generically as a basis for all discussed embodiments.

The MR imaging system 110 includes a main magnet 114 provided for generating a static magnetic field. The main magnet 114 has a central bore that provides an examination space 116 around a center axis 118 for a subject of interest 120, usually a patient, to be positioned within. The subject of interest 120 is typically lying on a patient bed 142. Accordingly, in this embodiment, the central bore and therefore the static magnetic field of the main magnet 114 have a horizontal orientation in accordance with the center axis 118 and the patient bed 142. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) antenna device 140 designed as a whole-body coil having a tubular body. The RF antenna device 140 is sometimes also referred to as RF coil device. In an alternative embodiment, the RF antenna device 140 is designed as a head coil or any other suitable coil type for use in MR imaging systems 110. The RF antenna device 140 is provided for applying a RF magnetic field to the examination space 116 during RF transmit phases, i.e. TX mode of the MR imaging system 110, to excite nuclei of the subject of interest 120, which shall be covered by MR images. The RF antenna device 140 is also provided to receive MR signals from the excited nuclei during RF receive phases, i.e. RX mode of the MR imaging system 110. In a state of operation of the MR imaging system 110, RF transmit phases and RF receive phases are taking place in a consecutive manner. The RF antenna device 140 is arranged concentrically within the bore of the main magnet 114. A cylindrical RF shield device 124 is arranged concentrically between the magnetic gradient coil system 122 and the RF antenna device 140. Hence, the RF shield device 124 coaxially encompasses the RF antenna device 140. In some embodiments, the RF antenna device 140 and the RF shield device 124 are provided integrally.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 138 are installed between the MR imaging system control unit 126 and a RF transmitter unit 134 that is provided to feed RF power of an MR radio frequency to the RF antenna device 140 via a RF switching unit 136 during the RF transmit phases. The RF switching unit 136 in turn is also controlled by the MR imaging system control unit 126, and another control line 132 is installed between the MR imaging system control unit 126 and the RF switching unit 136 to serve that purpose. During RF receive phase, the RF switching unit 136 directs the MR signals from the RF antenna device 140 to the MR image reconstruction unit 130 after pre-amplification.

Figure 2:
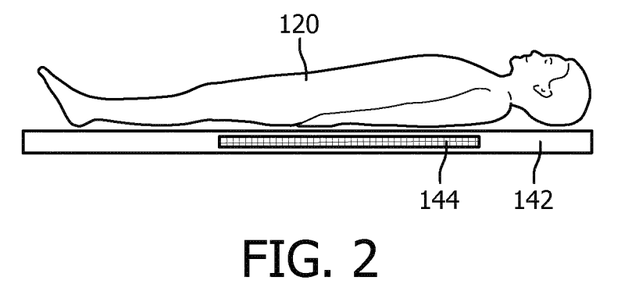
FIG. 2 is a schematic, lateral view of a patient bed with a passive radio frequency shim resonator and a subject of interest supported thereon according to a second embodiment.
Figure 3:
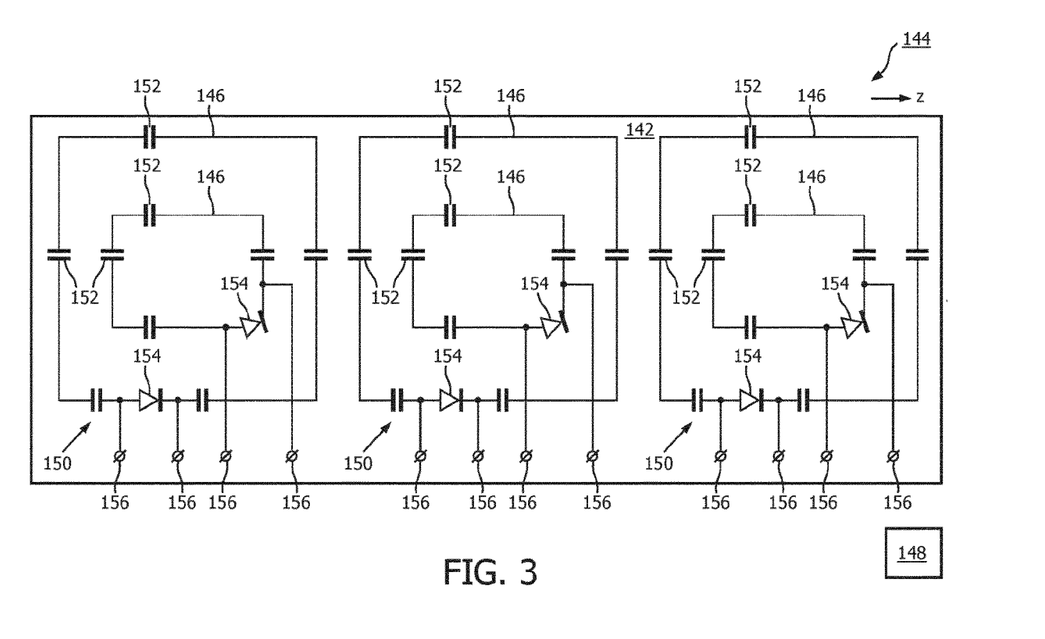
FIG. 3 is a schematic, top view of the patient bed shown in FIG. 2 with its passive RF shim resonator.

FIGS. 2 and 3 refer to a patient bed 142 according to a second embodiment. The patient bed 142 can be used together with the MR imaging system 110 of the first embodiment.

The patient bed 142 of the second embodiment comprises a passive radio frequency (RF) shim resonator 144 for field homogenization of the RF field emitted by the RF antenna device 140. The subject of interest 120 can be positioned on the patient bed 142 as described above.

The passive RF shim resonator 144 comprises multiple electromagnetically coupled resonant loops 146 and a control unit 148. The resonant loops 146 are provided in a lineal arrangement with three groups 150 of resonant loops 146, whereby each group 150 comprises two resonant loops 146, which are concentrically arranged.

Each resonant loop 146 comprises multiple coupling capacitors 152 and a PIN-diode 154 as switching unit. Each PIN-diode 154 is provided between control ports 156. The control ports 156 are connected to the control unit 148, which actively controls a voltage over the PIN-diodes 154 via control ports 156 to turn the PIN-diodes 154 conductive or not. Hence, the control unit 148 performs a control of all PIN-diodes 154, whereby the PIN-diodes 154 are commonly considered as switching device. The connection of the control ports 156 to the control unit 148 is not explicitly shown in FIGS. 2 and 3. Hence, with the PIN-diode 154 being conductive, the respective resonant loop 146 is turned conductive, i.e. a circular current can flow through the respective resonant loop 146. When the PIN-diode 154 is not conductive, the respective resonant loop 146 is interrupted, thereby interrupting the circular current through the respective resonant loop 146.

The control unit 148 operates the PIN diodes 154 to switch the electromagnetically coupled resonant loops 146 to provide a first and a second resonating capability in accordance with a TX-mode and a RX-mode of the RF field emitted by the RF antenna device 140 of the MR imaging system 110.

The first and the second resonating capability are provided in accordance with a TX-mode and a RX-mode of the RF field emitted by the RF antenna device 140 of the MR imaging system 110. Hence, the passive RF shim resonator 144 can be switched between transmit mode and receive mode, the first and the second resonating capability are optimized for the corresponding rotating RF field. For transmit mode, B1+ homogeneity and SAR are optimized, so that spatial variations of the RF field emitted by the RF antenna device 140, i.e. the transmit coil of the MRI system 110, can be reduced. Furthermore, whereas in receive mode, B1− homogeneity and SNR can be increased.

Figure 4:
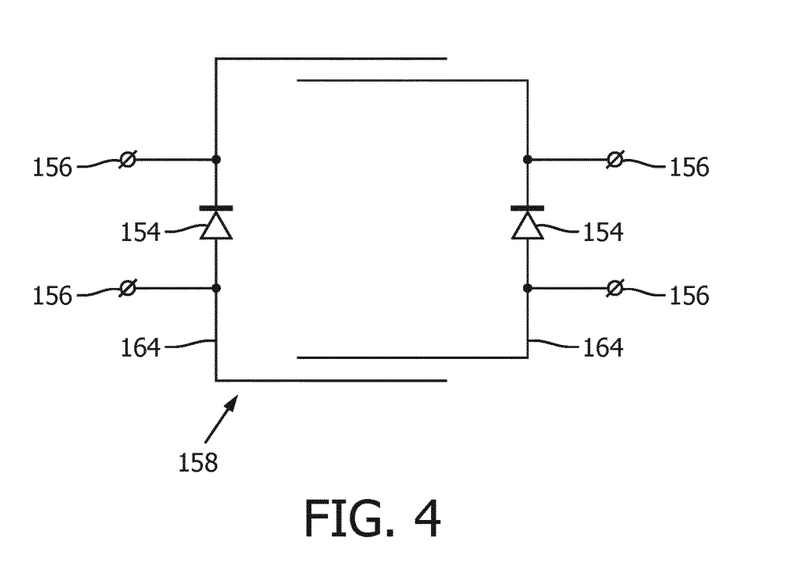
FIG. 4 is a schematic, top view of a passive dipole antenna for use in a passive RF shim resonator according to a third embodiment.

FIG. 4 refers to a passive dipole antenna 158 for use in a passive RF shim resonator 144 according to a third embodiment. The passive dipole antenna 158 and the passive RF shim resonator 144 according to a third embodiment can be used together with the MR imaging system 110 of the first embodiment. The general principles of the passive RF shim resonator 144 of the second embodiment, as discussed above, are also applicable to the passive dipole antenna 158 and the passive RF shim resonator 144 of the third embodiment.

As can be seen in FIG. 4, the passive dipole antenna 158 comprises two individual transmission lines 164, which are electromagnetically coupled. Each of the transmission lines 164 is provided with a PIN-diode 154. In accordance with the second embodiment, each PIN-diode 154 is provided between control ports 156, which are connected to a control unit 148, which actively controls a voltage over the PIN-diodes 154 via control ports 156 to turn the PIN-diodes 154 conductive or not. The control unit 148 is not explicitly shown in FIG. 4. Hence, with the PIN-diode 154 being conductive, the respective transmission line 164 is turned active, i.e. the dipole antenna 158 is activated. When the PIN-diode 154 is not conductive, the respective transmission line 164 is interrupted.

The passive RF shim resonator 144 of the third embodiment comprises multiple passive dipole antennae 158, which are commonly arranged in a plane of a patient bed 142.

Figure 5:
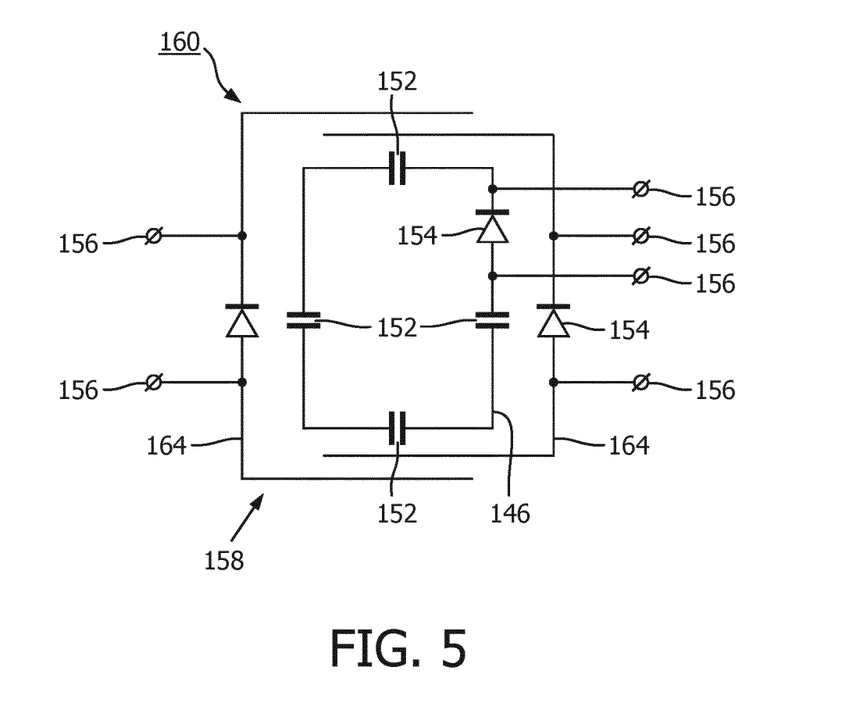
FIG. 5 is a schematic, top view of a combination of a passive dipole antenna together with a resonant loop for use in a passive RF shim resonator according to a fourth embodiment.

FIG. 5 refers to an antenna arrangement 160 for use in a passive RF shim resonator 144 according to a fourth embodiment. The antenna arrangement 160 for use in a passive RF shim resonator 144 according to the fourth embodiment can be used together with the MR imaging system 110 of the first embodiment. The general principles of the passive RF shim resonator 144 of the second and/or of the third embodiment, as discussed above, are also applicable to the antenna arrangement 160 and the passive RF shim resonator 144 of the fourth embodiment.

As can be seen in FIG. 5, the antenna arrangement 160 of the fourth embodiment comprises a passive dipole antenna 158 according to the third embodiment and a resonant loop 146 according to the second embodiment. The resonant loop 146 is surrounded by the transmission lines 164 of the passive dipole antenna 158. The details of the passive dipole antenna 158 of the third embodiment and a resonant loop 146 of the second embodiment, as discussed above, apply.

Control ports 156 of the passive dipole antenna 158 and the resonant loop 146 are connected to a control unit 148, which actively controls a voltage over all PIN-diodes 154 via the control ports 156 to turn each of the PIN-diodes 154 conductive or not. The control unit 148 is not explicitly shown in FIG. 5. The respective resonant loop 146 and the passive dipole antenna 158 are controlled to provide a first and a second resonating capability in accordance with a TX-mode and a RX-mode of the RF field emitted by the RF antenna device 140 of the MR imaging system 110.

Figure 6:
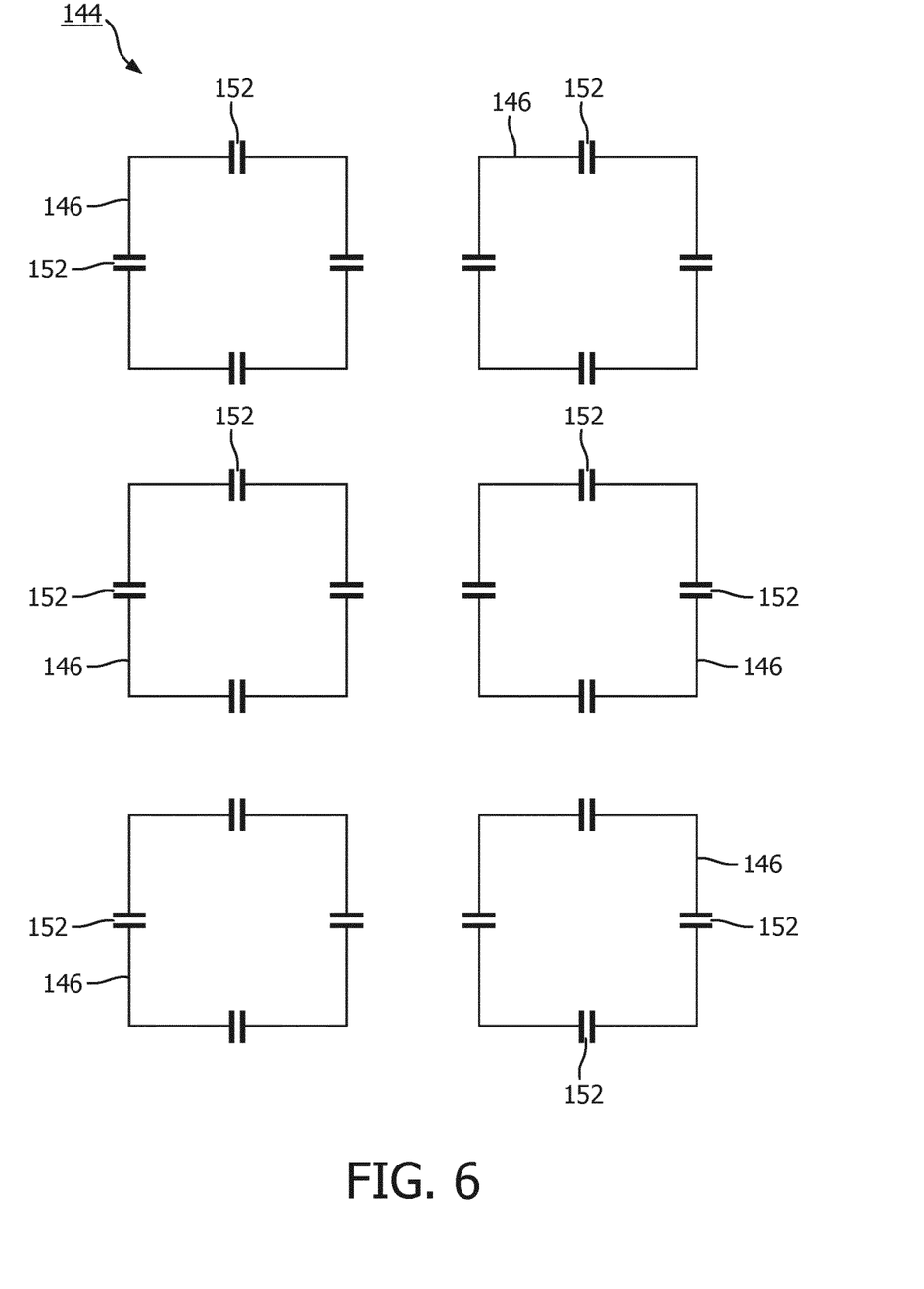
FIG. 6 is a schematic, top view of an arrangement of multiple resonant loops forming a passive RF shim resonator in a two-dimensional structure according to a fifth embodiment.

FIG. 6 refers to a passive RF shim resonator 144 according to a fifth embodiment. The passive RF shim resonator 144 according to the fifth embodiment can be used together with the MR imaging system 110 of the first embodiment. The general principles of the passive RF shim resonator 144 of the second to fourth embodiments, as discussed above, are also applicable to the antenna arrangement 160 and the passive RF shim resonator 144 of the fifth embodiment.

As can be seen in FIG. 6, the passive RF shim resonator 144 of the fifth embodiment comprises multiple resonant loops 146, which are arranged in a plane with two resonant loops 146 located besides each other in a lateral direction and three resonant loops 146 located on top of each other in a vertical direction. This arrangement of the resonant loops 146 is shown merely by way of example.

In an alternative embodiment, at least some of the resonant loops 146 are replaced by antenna arrangements 160 of the fourth embodiment and/or by passive dipole antennae 158 of the third embodiment.

Figure 7:
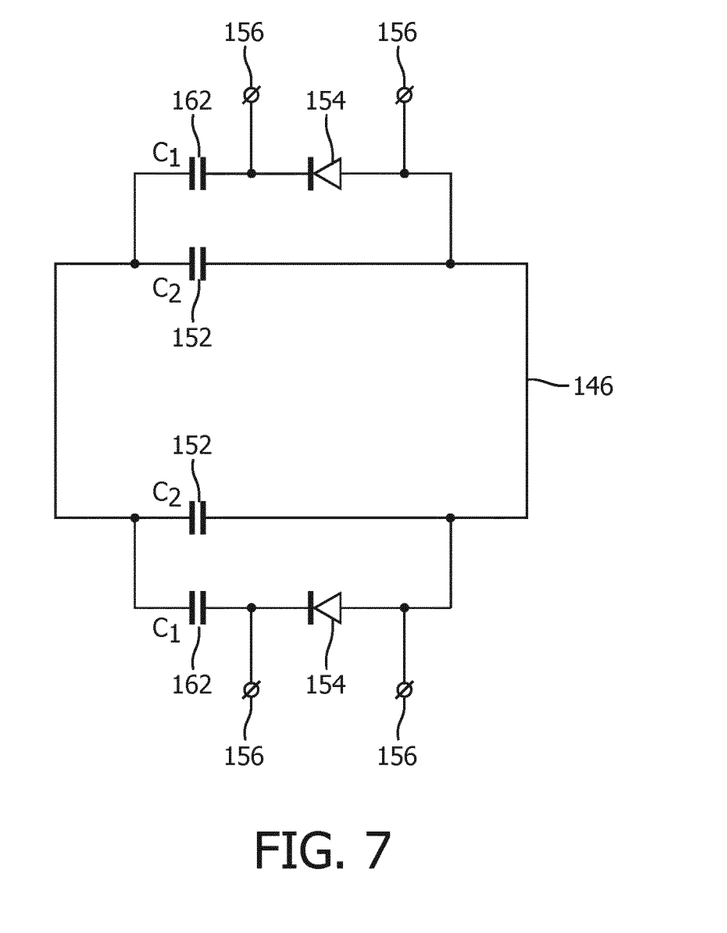
FIG. 7 is a detailed, top view of a single resonant loop with control pins according to a sixth embodiment.

FIG. 7 refers to a resonant loop 146 and a passive RF shim resonator 144 according to a sixth embodiment. The passive RF shim resonator 144 according to the sixth embodiment can be used together with the MR imaging system 110 of the first embodiment. The general principles of the passive RF shim resonator 144 of the previous embodiments, as discussed above, are also applicable to the passive RF shim resonator 144 of the sixth embodiment.

The passive RF shim resonator 144 of the sixth embodiment is provided in general in accordance with the passive RF shim resonator 144 of the second embodiment. The passive RF shim resonator 144 can comprise multiple electromagnetically coupled resonant loops 146, as described below.

The resonant loop 146 comprises two coupling capacitors 152. A tuning capacitor 162 is connected in parallel to each coupling capacitor 152. A PIN-diode 154 is provided as switching unit in series with each tuning capacitor 162. Each PIN-diode 154 is provided between control ports 156. The control ports 156 are connected to control unit 148, which actively controls a voltage over the PIN-diodes 154 via the control ports 156 to turn the PIN-diodes 154 conductive or blocking. The control unit 148 is not explicitly shown in FIG. 7.

Hence, with the PIN-diode 154 being conductive, the respective resonant loop 146 is tuned differently, since a coupling capacitance is formed by a sum of the capacitance of the respective coupling capacitor 152 and the capacitance of the respective tuning capacitor 162. With the PIN-diodes 154 in blocking mode, the coupling capacitance comprises merely the capacitance of the coupling capacitor 152.

The control unit 148 operates the PIN diodes 154 to switch the resonant loop 146 to provide a first and a second resonating capability in accordance with a TX-mode and a RX-mode of the RF field emitted by the RF antenna device 140 of the MR imaging system 110.

Figure 8:
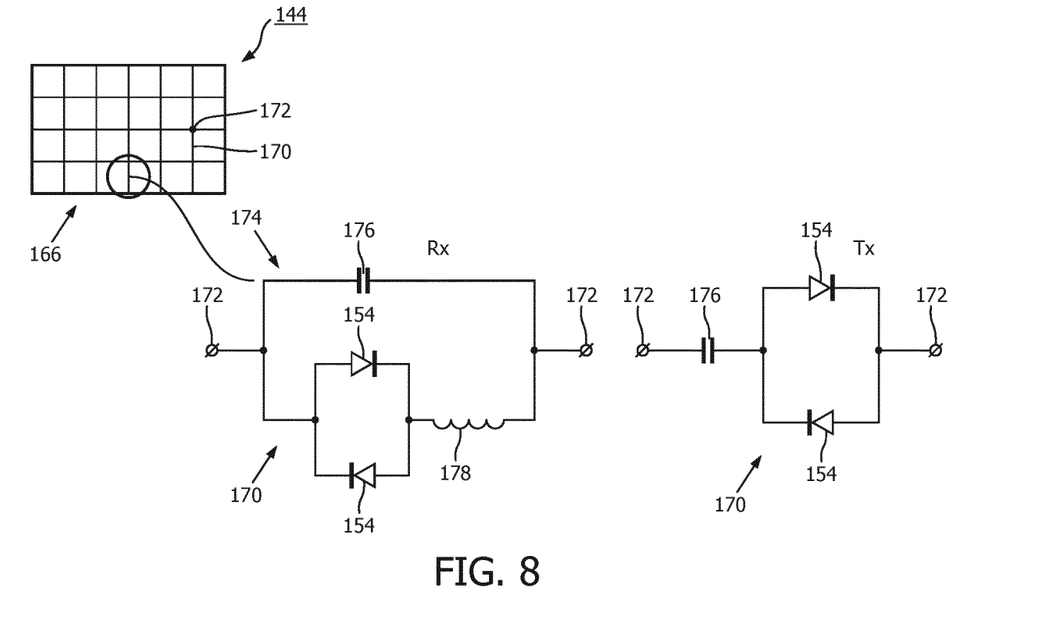
FIG. 8 is a schematic, top view of a passive RF shim resonator in a two-dimensional grid structure according to a seventh embodiment.

FIG. 8 shows a passive RF shim resonator 144 in a two-dimensional grid structure according to a seventh embodiment forming an artificial dielectric 166. The passive RF shim resonator 144 according to the seventh embodiment can be used together with the MR imaging system 110 of the first embodiment. The general principles of the passive RF shim resonator 144 of the previous embodiments, as discussed above, are also applicable to the antenna arrangement 160 and the passive RF shim resonator 144 of the seventh embodiment.

The passive RF shim resonator 144 of the seventh embodiment comprises a two-dimensional mesh structure with multiple branches 170, which are interconnected at connecting points 172 at each intersection of the branches 170. Each branch 170 can comprise a resonant circuit 174. Accordingly, each branch 170 can be loaded by branch capacitors 176 or branch inductors 178 to perform a tuning for independent B+ and B-homogenization in accordance with TX mode and RX mode of the RF field emitted by the RF antenna device 140 of the MR imaging system 110.

Accordingly, as can be further seen in FIG. 8, the branches 170 are provided each with a pair of switching units 154 in an antiparallel configuration. As indicated in FIG. 8, branches 170 with different configurations can be used in order to provide the first and the second resonating capability in accordance with a TX-mode and a RX-mode of the RF field emitted by the RF antenna device 140 of the MR imaging system 110. The branches 170 can be connected to form e.g. resonant loops 146 within the passive RF shim resonator 144.

Figure 9:
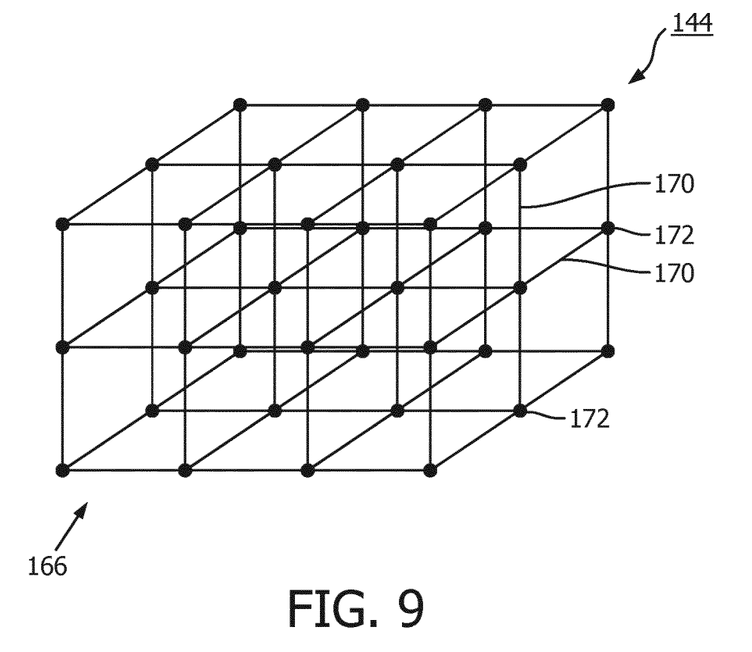
FIG. 9 is a schematic, perspective view of a passive RF shim resonator in a three-dimensional grid structure according to an eighth embodiment.

FIG. 9 shows a passive RF shim resonator 144 in a three-dimensional grid structure providing an artificial dielectric 166 according to an eighth embodiment. The principles of the two-dimensional passive RF shim resonator 144 of the seventh embodiment apply.

Figure 10:
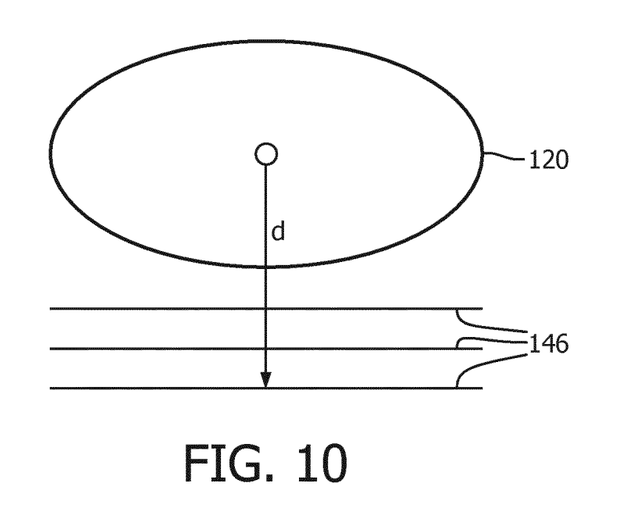
FIG. 10 is a schematic, lateral view of a passive RF shim resonator with three resonant loops provided on top of each other in a stacked arrangement according to a ninth embodiment.

FIG. 10 shows a passive RF shim resonator 144 with three resonant loops 146 provided on top of each other in a stacked arrangement according to a ninth embodiment. The three resonant loops 146 can be identical to those of any of the previous embodiments. Alternatively, the three resonant loops 146 can be formed by respectively switching the passive RF shim resonator 144 with the three-dimensional grid structure according to the eighth embodiment.

Figure 11A:
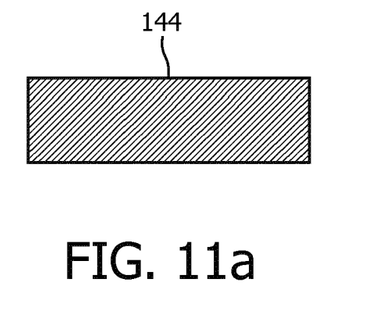
FIG. 11a is a schematic, lateral view of a passive RF shim resonator with a first internal structure according to a tenth embodiment.
Figure 11B:
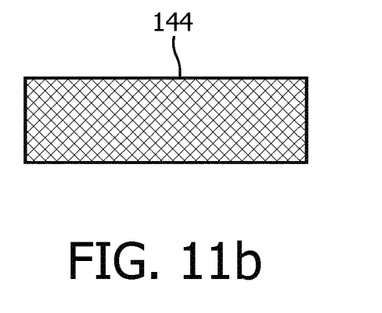
FIG. 11b is a schematic, lateral view of a passive RF shim resonator with a second internal structure according to an eleventh embodiment.

FIGS. 11a and 11b refer to passive RF shim resonators 144 with a first and second internal structure according to a tenth and eleventh embodiment. As indicated in FIGS. 11a and 11b, the passive RF shim resonators 144 of the tenth and eleventh embodiment are provided with different patterns of two-dimensional or three-dimensional grid structures, which are wavelength adapted to a MRI frequency and body size. Furthermore, an integration of branch inductors 176 or branch capacitors 174 in combination with local E shields or ceramic dielectric solid or liquid structures can be provided.

Figure 12:
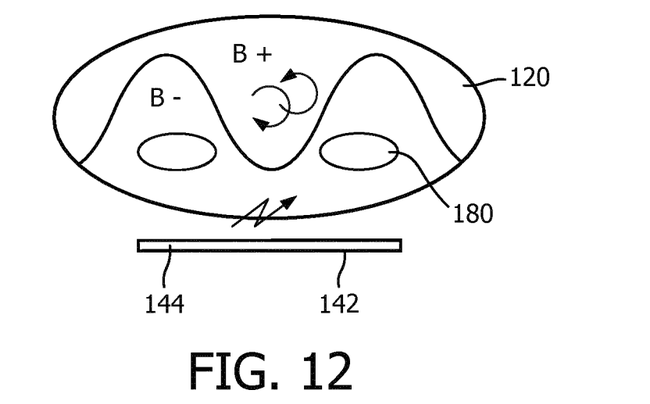
FIG. 12 is a schematic view of a subject of interest positioned on a patient bed with a passive RF shim resonator according to any previous embodiment with darkspots formed at MR image generation.
Figure 13:
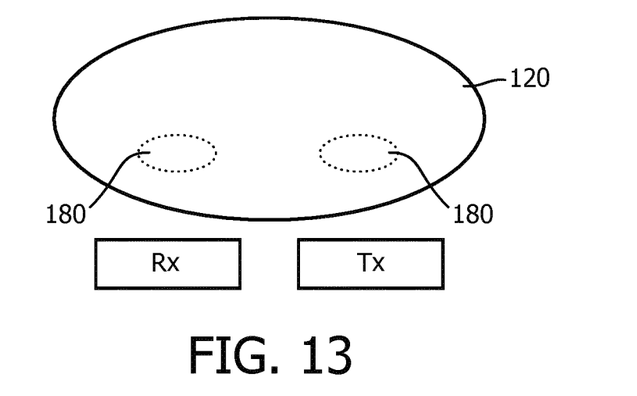
FIG. 13 is a schematic view in accordance with FIG. 12 indicating formation of different darkspots formed at MR image generation for TX mode and for RX mode of the MR imaging system.

FIGS. 12 and 13 refer to a passive RF shim resonator 144 with a patient bed 142 and a passive RF shim resonator 144, a subject of interest 120, i.e. a person in this example, is positioned on the patient bed 142 for examination. As indicated in FIGS. 12 and 13, B-fields in different rotating directions can be applied, leading to black spots 180. These black spots 180 are located differently for TX mode and RX mode of the RF antenna device 140.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space
118 center axis
120 subject of interest
122 magnetic gradient coil system
124 RF shield device
126 MR imaging system control unit
128 monitor unit
130 MR image reconstruction unit
132 control line
134 RF transmitter unit
136 RF switching unit
138 control line
140 radio frequency (RF) antenna device
142 patient bed
144 passive RF shim resonator
146 resonant loop
148 control unit
150 group of resonant loops
152 coupling capacitor
154 PIN-diode, switching unit
156 control port
158 dipole antenna
160 antenna arrangement
162 tuning capacitor
164 transmission line
166 artificial dielectric
170 branch
172 connecting point
174 resonant circuit
176 branch capacitor
178 branch inductor
180 black spot

The invention claimed is:

1. A passive radio frequency (RF) shim resonator for field homogenization of an RF field emitted by an RF antenna device of a magnetic resonance (MR) imaging system,
the passive RF shim resonator comprising:
a first resonating capability and a second resonating capability, switching device configured to switch between the first resonating capability and the second resonating capability, wherein
in accordance with a transmit (TX)-mode and a receive (RX)-mode to tune the passive RF shim resonator for independent homogenization of the clockwise and counter-clockwise rotating circular polarised magnetic field components ($B_1^{\pm}$), respectively of the RF field emitted by the RF antenna device of the MR imaging system.

2. The passive radio frequency (RF) shim resonator according to preceding claim 1, wherein
the passive RF shim resonator comprises a single or multiple electromagnetically coupled resonant loops, and
the switching device comprises at least one switching unit arranged in the single or multiple electromagnetically coupled resonant loops, and
the switching device is operated so that the at least one switching unit switches the single or multiple electromagnetically coupled resonant loops to provide the first and the second resonating capability using the single or multiple electromagnetically coupled resonant loops.

3. The passive radio frequency (RF) shim resonator according to preceding claim 2, wherein
the passive RF shim resonator comprises multiple electromagnetically coupled resonant loops,
the resonant loops are arranged in a 2D or 3D grid structure forming an artificial dielectric,
the switching device comprises multiple switching units arranged in the multiple electromagnetically coupled resonant loops, and
the switching units switch the single or multiple electromagnetically coupled resonant loops to provide the first and the second resonating capability using the single or multiple electromagnetically coupled resonant loops.

4. The passive radio frequency (RF) shim resonator according to preceding claim 3, wherein
the resonant loops are arranged in branches interconnecting connecting points of the grid structure.

5. The passive radio frequency (RF) shim resonator according to claim 2, wherein
the switching device comprises at least one switchable resonant circuit.

6. The passive radio frequency (RF) shim resonator according to claim 1, wherein
the passive RF shim resonator comprises a single or multiple electromagnetically coupled transmission lines,
the switching device comprises at least one switching unit arranged in the single or multiple electromagnetically coupled transmission lines, and
the switching device is operated so that the at least one switching unit switches the single or multiple electromagnetically coupled transmission lines to provide the first and the second resonating capability using the single or multiple electromagnetically coupled transmission lines.

7. The passive radio frequency (RF) shim resonator according to claim 1, wherein
the passive RF shim resonator comprises a single or multiple coupled dielectric resonators,
the switching device comprises at least one switching unit arranged in the single or multiple coupled dielectric resonators, and
the switching device is operated so that the at least one switching unit switches the single or multiple coupled dielectric resonators to provide the first and the second resonating capability using the single or multiple coupled dielectric resonators.

8. The passive radio frequency (RF) shim resonator according to claim 1, wherein
the switching device is an actively controllable switching device,
the passive RF shim resonator comprises a control unit, whereby
the control unit is adapted to actively switch the switching device between the first and the second resonating capability in accordance with a TX-mode and a RX-mode of the RF field emitted by the RF antenna device of the MR imaging system.

9. The passive radio frequency (RF) shim resonator according to claim 1, wherein
the switching device is a passive switching device, and
the switching device passively switches between the first and the second resonating capability in accordance with a TX-mode and a RX-mode of the RF field emitted by the RF antenna device of a MR imaging system.

10. The passive radio frequency (RF) shim resonator according to claim 1, wherein
the first resonating capability is adapted to achieve field optimization for a transmit field of the RF antenna device, and the second resonating capability is adapted to achieve field optimization for a receive field of the RF antenna device, or vice versa.

11. A patient bed or a patient mattress for use in a magnetic resonance imaging (MRI) system, wherein
the patient bed or the patient mattress comprises a passive radio frequency (RF) shim resonator (144) for field homogenization of an RF field emitted by a RF antenna device of a MR imaging system according to claim 1.

12. A magnetic resonance (MR) imaging system, comprising
a main magnet for generating a static magnetic field,
a magnetic gradient coil system for generating gradient magnetic fields superimposed to the static magnetic field, and
at least one radio frequency (RF) antenna device for generating a RF field, wherein
the magnetic resonance (MR) imaging system further comprises a patient bed or a patient mattress according to preceding claim 11.

13. A radio frequency (RF) antenna device for generating and/or receiving a RF field for use in a magnetic resonance imaging (MRI) system, wherein
the RF antenna device comprises a coil housing and a passive radio frequency (RF) shim resonator for field homogenization of a RF field emitted by the RF antenna device according to claim 1, wherein
the passive RF shim resonator is located within the coil housing.

14. A magnetic resonance (MR) imaging system, comprising
a main magnet for generating a static magnetic field,
a magnetic gradient coil system for generating gradient magnetic fields superimposed to the static magnetic field, and
at least one radio frequency (RF) antenna device for generating a RF field, wherein
the at least one RF antenna device is a RF antenna device according to preceding claim 13.

15. A method for improving field homogenization of an RF field emitted by an RF antenna device of a magnetic resonance (MR) imaging system, comprising the method steps of
providing a passive RF shim resonator having a first resonating capability and a second resonating capability in accordance with a TX-mode and a RX-mode of the RF antenna device,
determining a TX-mode and a RX-mode of the RF antenna device of the MR imaging system, and
switching the passive RF shim resonator between the first and the second resonating capability, in accordance with a TX-mode and a RX-mode to tune the passive RF shim resonator for independent homogenization of the clockwise and counterclockwise rotating circular polarised magnetic field components ($B_1^{\pm}$), respectively of the RF field emitted by the RF antenna device of the MR imaging system.

* * * * *